(12) United States Patent
Cachina et al.

(10) Patent No.: US 7,347,750 B2
(45) Date of Patent: Mar. 25, 2008

(54) SOLDER-BEARING CONTACTS AND METHOD OF MANUFACTURE THEREOF AND USE IN CONNECTORS

(75) Inventors: Joseph Cachina, Warwick, RI (US); James Zanolli, North Smithfield, RI (US); Jack Seidler, Flushing, NY (US)

(73) Assignee: Interplex Nas, Inc., Flushing, NY (US)

( * ) Notice: Subject to any disclaimer, the term of this patent is extended or adjusted under 35 U.S.C. 154(b) by 219 days.

(21) Appl. No.: 10/922,789

(22) Filed: Aug. 19, 2004

(65) Prior Publication Data

US 2005/0109524 A1    May 26, 2005

Related U.S. Application Data

(60) Provisional application No. 60/499,811, filed on Sep. 2, 2003.

(51) Int. Cl.
*H01R 4/02* (2006.01)

(52) U.S. Cl. ..................................... 439/876

(58) Field of Classification Search ................. 439/83, 439/876, 75, 86; 361/804, 770
See application file for complete search history.

(56) References Cited

U.S. PATENT DOCUMENTS

| | | | |
|---|---|---|---|
| 2,752,580 A * | 6/1956 | Shewmaker | ................. 439/75 |
| 4,597,625 A | 7/1986 | Seidler | |
| 4,802,862 A | 2/1989 | Seidler | |
| 4,883,435 A | 11/1989 | Seidler | |
| 5,139,448 A | 8/1992 | Seidler | |
| 5,334,059 A | 8/1994 | Seidler | |
| 6,179,631 B1 * | 1/2001 | Downes et al. | ................. 439/83 |
| 6,224,399 B1 * | 5/2001 | Yacoub | ....................... 439/83 |
| 6,543,129 B2 | 4/2003 | Cachina et al. | |
| 6,595,788 B2 * | 7/2003 | Harper et al. | ................. 439/83 |
| 6,623,283 B1 * | 9/2003 | Torigian et al. | .............. 439/83 |
| 6,700,079 B2 | 3/2004 | Bogursky et al. | |
| 6,773,269 B1 * | 8/2004 | Downes | ....................... 439/75 |
| 6,818,839 B2 * | 11/2004 | Hosaka et al. | .............. 174/262 |

* cited by examiner

*Primary Examiner*—Phuong Dinh
(74) *Attorney, Agent, or Firm*—Darby & Darby P.C.

(57) ABSTRACT

In one aspect, a surface mount contact is provided for attachment to a circuit board or the like. The contact includes an elongated electrically conductive pin that has a first end and an opposing second end. A pre-formed heat re-flowable material is attached to one end of the pin and a conductive locator member surrounds the pin at a location between the first and second ends thereof and adjacent the conductive locator member. In one embodiment, the locator member is in the form of a cylindrical collar that extends around the pin.

16 Claims, 2 Drawing Sheets

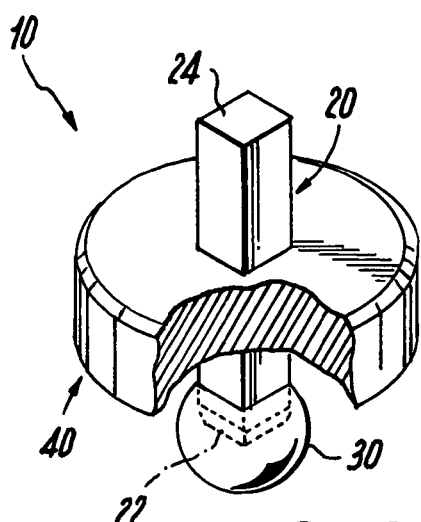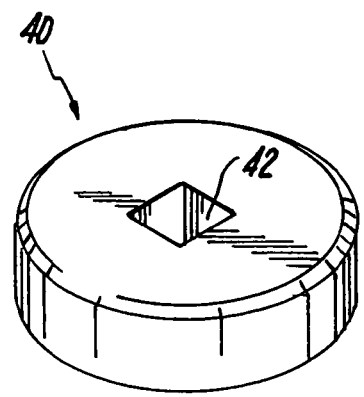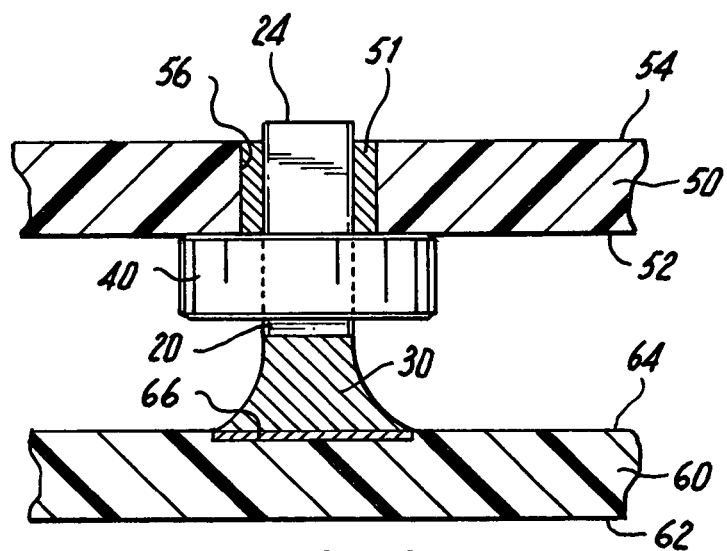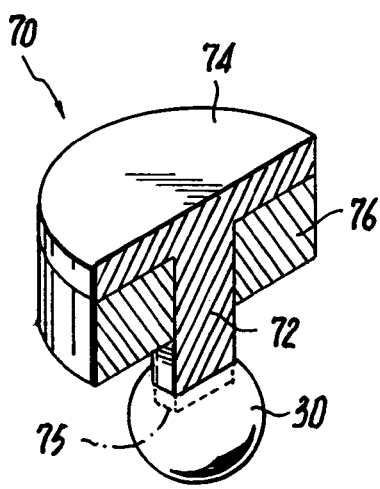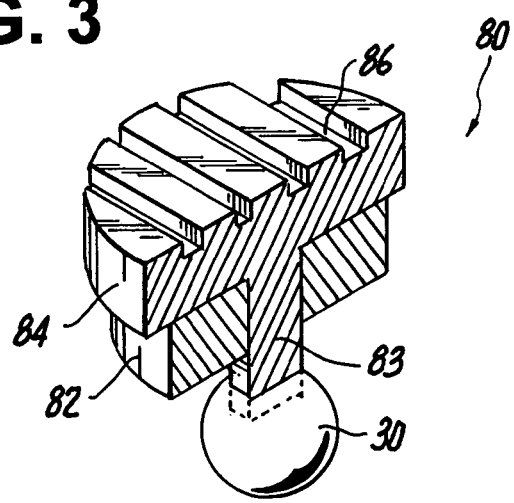

SOLDER-BEARING CONTACTS AND METHOD OF MANUFACTURE THEREOF AND USE IN CONNECTORS

CROSS-REFERENCE TO RELATED APPLICATION

The present application claims the benefit of U.S. patent application Ser. No. 60/499,811, filed Sep. 2, 2003, which is hereby incorporated by reference in its entirety.

TECHNICAL FIELD

The present invention relates to the field of devices for joining electrical components to one another and, more particularly, to an apparatus for facilitating the soldering of a first electronic device, such as a printed circuit board or connector, to a second electronic device, such as a printed circuit board and to a method of forming a solder ball on a contact.

BACKGROUND

It is often necessary and desirable to electrically connect one component to another component. For example, a multi-terminal component, such as a connector, is often electrically connected to a substrate, such as a printed circuit board, so that the contacts or terminals of the component are securely attached to contact pads formed on the substrate and/or to holes lined with an electroplating material in the substrate to provide an electrical connection therebetween. One preferred technique for securely attaching the component terminals to the contact pads and/or plated lining holes is to use a solder material.

When joining a multi-terminal component, such as a connector, to a substrate by soldering, particularly a substrate with internally plated holes, special provisions have often been required, such as shown in U.S. Pat. Nos. 4,597,625; 4,802,862; 4,883,435; 5,139,448; and 5,334,059, all of which are incorporated herein by reference in their entirety. Such components have terminals which do not carry solder, so that these situations have generally required special means for providing solder to the component terminals and to contact pads on the substrate. One approach to providing solder to the component terminals and contact pads is to provide solder paste in and around the particular area, such a hole. However, this approach generally does not provide a sufficient volume of solder to properly join the component terminals and contact pads.

In the mounting of an integrated circuit (IC) on a substrate (e.g., formed of a plastic or a ceramic), the use of ball grid array (BGA) or other similar packages has become common. In a typical BGA, spherical solder balls attached to the IC package are positioned on electrical contact pads of a circuit substrate to which a layer of solder paste has been applied. The solder paste is applied using any number of techniques, including the use of a screen or mask. The unit is then heated to a temperature at which the solder paste and at least a portion or all of the solder balls melt and fuse to an underlying conductive pad formed on the circuit substrate. The IC is thereby connected to the substrate without need of external leads on the IC.

The BGA concept also offers significant advantages in speed, density, and reliability and as a result, the BGA package has become the packaging option of choice for high performance semiconductors. The inherent low profile and area array configuration provide the speed and density and the solid solder spheres provide enhanced solder joint reliability. Reliability is enhanced because the solder joints occur on a spheroid shape of solid solder. The spheroid shape, when properly filleted, provides more strength than flat or rectangular shaped leads of equivalent area. The solid solder composition provides a more reliable solder joint than conventional stamped and plated leads because there can be no nickel underplate or base metal migration to contaminate or oxidize the solderable surface, or weak intermetallic layers than can form when the solder bonds to a nickel underplate. Further, tin and tin plating processes used on conventional stamped and plated leads have additives than can inhibit solderability. Enhanced solder joint reliability is particularly important to an area array package because the solder joints cannot be visually inspected.

While the use of a BGA connector in connecting the IC to the substrate has many advantages, there are several disadvantages and limitations of such devices. It is important for most situations that the substrate-engaging surfaces of the solder balls are coplanar to form a substantially flat mounting interface so that in the final application, the solder balls will reflow and solder evenly to the planar printed circuit board substrate. If there are any significant differences in solder coplanarity on a given substrate, this can cause poor soldering performance when the connector is reflowed onto a printed circuit board. In order to achieve high soldering coplanarity, very tight coplanarity requirements are necessary. The coplanarity of the solder balls is influenced by the size of the solder balls and their positioning on the connector.

Conventional BGA connector designs attach loose solder balls to the assembled connector. The attachment process requires some type of ball placement equipment to place solder balls on a contact pad or recessed area of the connector that has been applied with a tacky flux or solder paste. The connector then goes through a reflow oven to solder the balls to the contact. The process is slow, sensitive, and requires expensive, specialized equipment.

An example of a BGA type connector is described in U.S. Pat. No. 6,079,991, ('991) to Lemke et al., which is herein incorporated by reference in its entirety. The connector includes a base section having a number of outer recesses formed on an outer surface of the base section. Similarly, the base section also has a number of inner recesses formed on an inner surface of the base section. The inner recesses are designed to receive contacts and the outer recesses are designed to receive solder balls so that the solder balls are fused to bottom sections of the contacts which extend into the outer recesses. The contacts comprise both ground/power contacts and signal contacts with top sections of the contacts providing an electrical connection with an electronic device by known techniques. Another electronic device, e.g., a PCB, is electrically connected to the contacts by soldering the solder balls onto contacts formed on the PCB, thereby providing an electrical connection between the two electronic devices.

While the '991 connector is suitable for use in some applications, it suffers from several disadvantages. First, the connections between the solder balls and the bottom sections of the contacts may lack robustness and durability since the solder balls are simply placed in the outer recesses and then reflowed to form the electrical connection between the contact and one electronic device. Accordingly, only a portion of each solder ball is in contact with the bottom section of one contact before and after the soldering process. Second, because the solder balls are simply inserted into the outer recesses, the solder balls may not be coplanar with one another during the use of the connector and during the reflow process. Another disadvantage of this type of connector is that the solder joints are especially susceptible to fracturing during thermal expansion and cooling. The base section and the printed circuit board typically each has a different coefficient of thermal expansion and therefore when both are heated, one component will expand greater than the other. This may result in the solder joint fracturing because the solder ball is confined within the outer recess and the movement of the end of the contact to which the solder ball is attached is limited due to housing constraints. In other words, the contact is held in place within the housing substrate and only slightly protrudes into the recess where the solder ball is disposed. The contact therefore is effectively held rigid and not permitted to move during the reflow process.

In addition, the costs associated with manufacturing the '991 connector are especially high since the contacts must be placed in the base section and then the individual solder balls must be placed within the outer recesses formed in the base section. A BGA type connector likely includes hundreds of solder balls and thus, the process of inserting individual solder balls into the outer recesses requires a considerable amount of time and is quite costly.

Another type of solder ball contact is disclosed in U.S. Pat. No. 6,700,079. In the '079 patent, a surface mount contact for attachment to a circuit board is provided and includes an elongate electrically conductive pin defining a shaft having an upper end and a lower end. A pre-formed heat re-flowable material, such as a solder ball, is attached to the lower end of the pin and an insulator, such as a collar, surrounds the pin intermediate the upper and lower ends and is adjacent the pre-formed heat re-flowable material. While this device may have some particular utility, there are a number of disadvantages associated therewith. More specifically, the upper end of the pin is typically inserted into and secured within an opening in the upper PCB, while the pre-formed heat re-flowable material is reflowed to cause a connection with a second component, such as another printed circuit board. The insulator acts as a stop and is disposed adjacent the upper PCB. As one will appreciate, an insulator does not attract heat and therefore, heat remains trapped between the insulator and the upper PCB and this can lead to a build up in heat in this interface region. In other words, heat can be trapped by the insulator and this can cause damage to the upper PCB since many components thereof are heat sensitive and thus are adversely affected by a heat buildup.

It is therefore desirable to provide an alternate surface mount contact for attachment to a circuit board or a connector which overcomes the above noted deficiencies.

SUMMARY

In one aspect, a surface mount contact is provided for attachment to a circuit board or the like. The contact includes an elongated electrically conductive pin that has a first end and an opposing second end. A pre-formed heat re-flowable material is attached to one end of the pin and a conductive locator member surrounds the pin at a location between the first and second ends thereof and adjacent the conductive locator member. In one embodiment, the locator member is in the form of a cylindrical collar that extends around the pin.

The locator member acts as a stop or locator since it abuts one face of an electronic device when the contact is securely connected to the electronic device. By being formed of a thermally dissipative, conductive material, the locator member serves to prevent or substantially reduce the likelihood that heat can become trapped underneath the locator member at the interface between the locator member and the electronic device. Trapped heat can lead to damage to the electronic device or malfunction thereof.

In another aspect, one of the faces of the locator member is modified to facilitate the formation of a solder ball at one end of the contact. More specifically, a process is provided whereby a mass of molten solder material is introduced to the modified face and the face profile causes the molten solder material to form a solder ball about the contact pin. In other words, one end of the contact pin is embedded in the solder ball. This process thus eliminates the step of having to first pre-form and then attach the solder ball to the contact pin.

Other features and advantages of the present invention will be apparent from the following detailed description when read in conjunction with the accompanying drawings.

BRIEF DESCRIPTION OF DRAWING FIGURES

The foregoing and other features of the present invention will be more readily apparent from the following detailed description and drawings figures of illustrative embodiments of the invention in which:

FIG. 1 is a perspective view, in partial cross-section, of a surface mount contact with a heat re-flowable material being coupled to one end of an electrically conductive pin;

FIG. 2 is a perspective view of one exemplary locator member that forms a part of the contact of FIG. 1;

FIG. 3 is a cross-sectional view of a circuit board assembly including the contact of FIG. 1 subsequent to re-flow of the heat re-flowable material associated with the contact;

FIG. 4 is perspective view, partially in cross-section, of a surface mount contact according to another embodiment;

FIG. 5 is a perspective view, partially in cross-section, of a surface mount contact according to yet another embodiment;

DETAILED DESCRIPTION OF PREFERRED EMBODIMENTS

Figure 6:
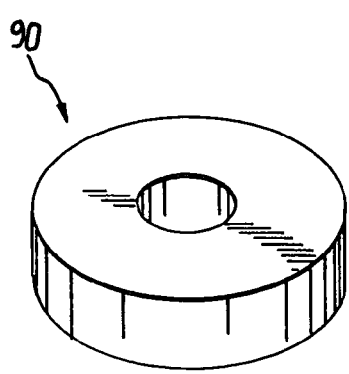
FIGS. 6 and 7 are perspective views that illustrate cylindrical and square washer-like pre-formed heat re-flowable members that can be used in place of the solder ball shown in FIG. 1.

FIGS. 1 and 2 illustrate a surface mount contact 10 according to a first embodiment and for attachment to a planar circuit board 50 (FIG. 3). The contact 10 includes an elongated electrically conductive pin 20 that has a first end 22 and an opposing second end 24. Typically, the pin 20 is formed of a metal. The pin 20 can come in any number of different shapes and sizes and for purposes of illustration only, the illustrated pin 20 has a relatively square cross-section; however, it can easily have a circular or oval cross-section. The first end 22 of the pin 20 can be slightly tapered, rounded, etc. to facilitate the retaining of a heat re-flowable material, generally indicated at 30, as will be described below.

The contact 10 also includes a locator member 40 that surrounds a portion of the pin 20 and more specifically and according to one exemplary, the locator member 40 is a collar member that surrounds the shaft of the pin 20 at a location between the first and second ends 22, 24. In one exemplary embodiment and as illustrated in FIG. 2, the locator member 40 is in the form of a cylindrical collar that has an opening 42 that is complementary to the shape of the pin 20 so that the pin 20 can extend therethrough, resulting in the locator member 40 being disposed around an intermediate portion of the shaft with a small space between the pin 20 and the wall of the locator member 40. The illustrated opening 42 has a similar or the same cross-sectional shape as the pin 20 and consequently, the opening 42 has a square shape. It will clearly be understood that the square shape is merely exemplary in nature; however, it will be understood that other shapes are suitable.

In contrast to conventional constructions, the locator member 40 is formed of a conductive material as opposed to an insulator material. In one exemplary embodiment, the locator member 40 is formed of a material that is conductive and thermally dissipative as well as being non wettable relative to a solder material or the like. One type of material that has these characteristics is a metal and more particularly, the locator member 40 can be formed of aluminum or steel. By forming the locator member 40 out of a material that offers these characteristics, a number of advantages can be realized as described below.

When the contact 10 is prepared for use, the heat re-flowable material 30, e.g., solder, is coupled to the pin 20 by embedding or otherwise disposing the material 30 around the first end 22 of the pin 20. For example, the material 30 can be pre-formed to assume a distinct shape, such as a solder ball, and is then coupled to the first end 22 by embedding the pin 20 into the material 30 so that the material 30 is securely held on the first end 22 as shown in FIG. 1.

The pin 20 and the locator member 40 can be formed using conventional stamping techniques since these elements are formed of metal and therefore are susceptible to being formed in the above manner.

FIG. 3 illustrates one particular use for the contact 10 in a typical connector setting. More specifically, a first electronic device 50 is provided and can be in the form of an conventional connector or printed circuit board (PCB), as illustrated. The exemplary PCB 50 has a first face 52 and an opposing second face 54 and includes at least one bore 56 formed therethrough for receiving the pin 20. The bore 56 is therefore complementary in shape as the shape of the pin 20 so that the pin 20 is easily received within the bore 56. Preferably, there is a slight gap or space between the pin 20 and the walls defining the bore 56 so that a coupling material 51, such as solder, is received therein around the pin 20 to produce a secure electrically conductive connection between the pin 20 and the PCB 50. In FIG. 3, this coupling material 51 is in the form of solder material at and near the pin second end 24 that produces a soldered connection between the pin 20 and the PCB 50.

Preferably, the thickness of the PCB 50 is such that the second end 24 of the pin 20 does not or only slightly protrudes beyond the second face 54 when the contact 10 is securely connected to the PCB 50 during a given application. Of course, the second end 24 can extend a greater distance beyond the second face 54 in some certain applications.

The member 40 serves as a locating member since it limits the degree of travel of the pin 20 within the bore 56 of the PCB 50 by being positioned adjacent the first face 52 of the PCB 50. In other words, the member 40 acts as a stop by abutting the first face 52 of the PCB 50 and therefore, when the contact 10 is securely attached to the PCB 50, the member 40 sits flush against the first face 52.

The contact 10 can act as a connector by electrically connecting the first electronic device (PCB 50) to a second electronic device 60 which can be in the form of a connector or another PCB. In the illustrated embodiment, the second electronic device 60 is a second PCB that is electrically connected to the first PCB 50. The second PCB 60 includes a first face 62 and a second face 64 that faces the first face 52 of the first PCB 50. Instead of being of the type that has through bores formed therethrough, the second PCB 60 is of the type that has at least one and preferably a plurality of conductive pads 66 formed along the second face 64 and for electrical connection to the pin 20 of the contact 10. More specifically, the pin 20 is electrically connected to the conductive pad 66 by means of the heat re-flowable material 30.

The first end 22 is first positioned relative to the conductive pad 66 so that the heat re-flowable material 30 is disposed near or adjacent the conductive pad 66. Heat is applied to the PCB assembly as by conventional techniques (e.g., hot air, oven, etc.) so as to cause the material 30 to re-flow as illustrated in FIG. 3. As the material 30 re-flows, the material contacts and flows across the conductive pad 66 and when the material 30 cools, a secure soldered connection is formed between the conductive pad 66 and the first end 22 of the pin 20. Since the connection between the second end 24 and the first PCB 50 is of an electrically conductive type, the pin 20 serves to electrically connect the first PCB 50 to the second PCB 60. Accordingly, the contact 10 is through whole mounted relative to the first PCB 50 and is surface mounted relative to the second PCB 60.

It will be appreciated that this application illustrated in FIG. 3 demonstrates two parallel PCBs 50, 60 being interconnected by at least one and preferably a plurality of discrete laterally-spaced pinned solder balls (only one of which is illustrated). It is understood that the components mounted to the PCBs 50, 60 are not shown, but in a power supply application, typically, the upper PCB 50 is populated on both sides with electronic components. The second end 24 of the pin is seated within the bore 56, which can be a metallized via or plated through hole of the PCB 50.

One of the advantages of the present contact 10 is that the member 40 is formed of a conductive material, such as aluminum, as opposed to an insulator and furthermore, the member 40 has heat dissipating properties (unlike an insulator) and therefore the heat collecting disadvantages associated with conventional connectors are avoided. More specifically, the member 40 serves as a thermal dissipater and therefore heat is effectively wicked away from the first PCB 50 at an interface between the first PCB 50 and the member 40. Because the interface between the first pin end 22 and the first PCB 50 is of an electrically conductive nature, heat is generated during normal operation conditions. One will appreciate that the heat is generated at locations underneath the locator member 40 and since the locator member 40 seats flush against the first face 52, the locator member 40 acts to trap the heat underneath the member 40 and within the first PCB 50. This results in heat buildup and can lead to malfunction and/or damage to the first PCB 50. By placing a heat dissipating material near the interface connection between the contact 10 and the first PCB 50, heat is effectively dissipated through the member 40 away from the first PCB 50.

FIG. 4 illustrates yet another embodiment in which a contact 70 is provided and is adapted for surface mounting to a conductive pad (such as conductive pad 66 of FIG. 3) on the underside of an upper PCB 50. The contact 70 uses a shorter electrically conductive pin 72 that has a head portion 74 and a conductive locator member 76 is provided and surrounds the pin 72 as in the earlier embodiment. Preferably, the dimensions of the head portion 74 are about equal to the dimensions of the locator member 76 such that outer edges thereof are substantially axially aligned with one another. The heat re-flowable material 30 is disposed and retained at the free end 75 of the pin 72. The pin terminates at the head portion 74 so that the head portion 74 can act as a conductive pad that can be surface mounted and soldered to the respective conductive pad that is part of the PCB. The locator member 76 can be in the same form as the member 40 illustrated in FIG. 2 in that it can be a cylindrical collar that surrounds the pin that extends therethrough.

FIG. 5 illustrates yet another embodiment of a contact 80 which is similar to the contact 70 of FIG. 4 except for the below differences. In the contact 80, the dimensions of a locator member 82 do not necessarily have to match the dimensions of a head portion 84 of a pin 83. In the illustrated embodiment, the dimensions of the locator member 82 are less than the dimensions of the head portion 84 and thus the head portion 84 extends beyond the locator member 82. The head 84 is formed with a plurality of outwardly opening radially extending channels 86 in its upper surface. The upper surface of the channeled head 84 provides the principal contact with the conductive pad formed on the underside of the upper PCB. The channels preferably are formed so that they extend to the ends of the head 84 and are open thereat so as to permit out-gassing of vaporized solder flux. The formation of channels minimizes skating and helps self-centering of the pin to the pad during solder re-flow and also improves solder-joint strength.

Figure 7:
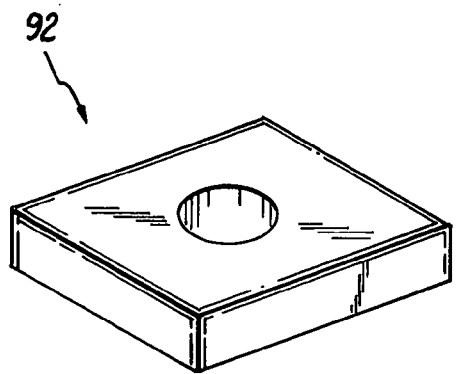

FIG. 6 illustrates a cylindrical pre-formed washer-like solder element 90 that can be formed on or otherwise disposed on (e.g., press fit) on one free end of the contact pin. FIG. 7 illustrates a square pre-formed washer-like solder element 92. As with the material 30 in the form of a solder ball, the elements 90, 92 can be spaced from the locator member or they can make slight contact therewith.

Figure 8:
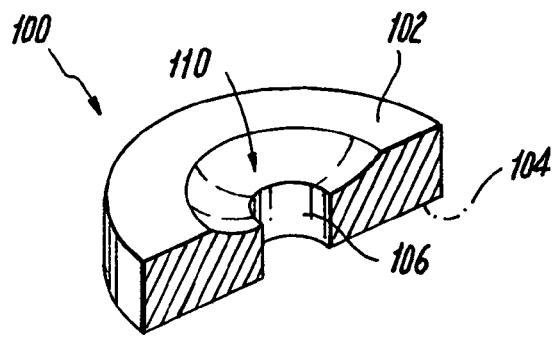
FIG. 8 is a perspective view, in partial cross-section, of a locator member according to another embodiment and having a recessed portion formed in a surface thereof.

In yet another aspect of the present invention, a method of forming a solder ball at the end of the electrically conductive pin of the contact is provided. FIG. 8 is a cross-sectional view of a locator member 100 according to another embodiment and includes a feature that facilitates the formation of a solder ball at the end of the electrically conductive pin. More specifically, the locator member 100 includes a first face 102 and an opposing second face 104. For purposes of illustration only, the locator member 100 is generally shown as a cylindrical collar; however, it will be appreciated that it can be in any number of different shapes. The locator member 100 has an opening or bore 106 formed therethrough to receive the electrically conductive pin of the contact. In this embodiment, the first face 102 has a recessed section 110 formed therein with the recessed section 110 being located about the bore 106. In other words, the bore 106 opens up into the recessed section 110. The recessed section 110 is generally dish-shaped and therefore is characterized as being a concave surface formed in the first face 102. Preferably, the bore 106 is centrally located within the recessed section 110 which is annular in shape.

Figure 9:
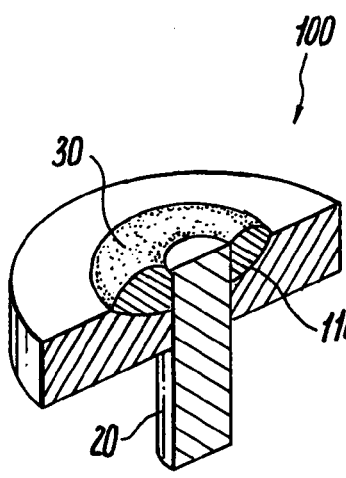
FIG. 9 is perspective view, in partial cross-section, of a surface mount contact including the locator member of FIG. 8 and a substrate of heat re-flowable material.
Figure 10:
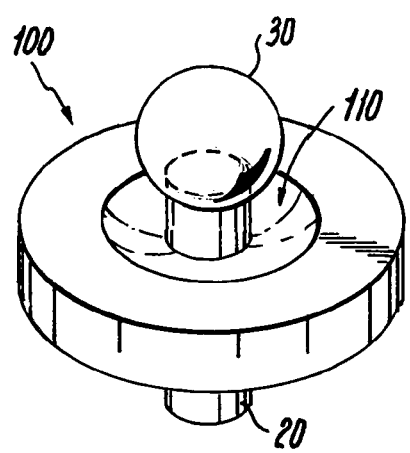
FIG. 10 is a perspective view of the contact of FIG. 9 illustrating solder ball formed by applying heat to the substrate of material.

The concave recessed section 110 actually facilitates the formation of a solder ball at the free end of the contact pin in the following manner. Molten solder 30 is introduced to the first face 102 of the locator member 100 as shown in FIG. 9 and the presence of the recessed section and the surface tension generated thereby between the non-wettable recessed area 110 and the solder material 30 causes the molten solder to form a solder ball above the recessed section 110 as shown in FIG. 10. Since the contact pin extends through the bore 106 and therefore extends above the recessed section 110, the solder ball forms around the contact pin. The result is that the contact pin is embedded in the solder ball and when the heat re-flowable material cools, the solder ball is securely connected to the contact pin.

In this manner, the heat re-flowable material does not have to be pre-formed prior to use with the contact and instead, molten material can be injected onto the face 112 about the contact pin to form a solder ball on the end of the contact pin. This permits the process to be automated and the contacts can be formed more easily since it requires less steps due to the elimination of the step of pre-forming the solder material and since an injector can be used to simply and effectively introduce an amount of solder material on the first face 102.

It will be appreciated that the locator member 110 according to this embodiment can be used as a part of any one of the contacts disclosed in the various present embodiments.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the art without departing from the scope of the present invention as set forth in the claims that follow, and equivalents thereof. In addition, the features of the different claims set forth below may be combined in various ways in further accordance with the present invention.

What is claimed is:

1. A surface mount contact for coupling to an electronic device comprising: a conductive pin having an elongated body including a first end and a second end; a heat re-flowable bonding member coupled to the first end; and a conductive substrate disposed around the conductive pin between the first and second ends and adjacent the heat re-flowable bonding member, wherein the substrate is a collar that radially protrudes from the pin and has an opening through which the pin extends and a surface thereof that is adjacent the heat re-flowable bonding member is conductive, wherein the second end of the pin has a head formed thereat for placement against a conductive surface and wherein the dimensions of the head are either substantially equal to dimensions of the conductive substrate or the dimensions of the head are greater than the dimensions of the conductive substrate.

2. A circuit board assembly comprising: a first circuit board having at least one first contact; a second circuit board having at least one second contact; and at least one surface mount contact of claim 1, wherein the second end of the pin is conductively coupled to the at least one first contact and the first end of the pin is conductively coupled to the at least one second contact by reflowing the heat re-flowable bonding member.

3. The assembly of claim 2, wherein the first circuit board comprises a printed circuit board with the first contact in the form of a through hole contact.

4. The assembly of claim 3, further including a second heat re-flowable bonding member disposed within the through hole contact to electrically connect the second pin end to the first contact.

5. The assembly of claim 2, wherein the second circuit board comprises a printed circuit board with the second contact in the form of a contact pad to which the heat re-flowable bonding member is attached after re-flowing thereof.

6. The assembly of claim 2, wherein one face of the locator member lies flush against an opposing face of the first printed circuit board.

7. The assembly of claim 2, wherein the locator member is formed of a metal that has a non-wettable surface that faces the heat re-flowable bonding member and on which the heat re-flowable bonding member is disposed.

8. A surface mount contact for coupling to an electronic device comprising: a conductive pin having an elongated body including a first end and a second end; a heat re-flowable bonding member coupled to the first end; and a conductive locator member disposed around the conductive pin between the first and second ends and adjacent the heat re-flowable bonding member, wherein the locator member is a collar that radially protrudes from the pin and has an opening through which the pin extends and a surface thereof that is adjacent the heat re-flowable bonding member is conductive, wherein the locator member has a first face and a second face with the first face having a recessed section.

9. The contact of claim 8, wherein the locator has an opening formed therethrough with the recessed section being formed about the opening.

10. The contact of claim 9, wherein the opening is centrally located in the recessed section.

11. The contact of claim 9, wherein the first face has a planar surface that surrounds an outer edge of the recessed section.

12. A surface mount contact for coupling to an electronic device comprising: a conductive pin having an elongated body including a first end and a second end; a heat re-flowable bonding member coupled to and being separate from the first end such that the heat re-flowable bonding member extends about at least a surface of the first end; and a conductive locator member disposed around the conductive pin between the first and second ends and immediately adjacent the heat re-flowable bonding member, the conductive locator member being movable along a longitudinal length of the conductor pin, wherein at least a first surface of the conductive locator member comprises a conductive profiled surface that is a non-wettable surface positioned such that it faces and is in intimate contact with the heat re-flowable bonding member.

13. The contact of claim 12, wherein the profiled surface comprises a concave shape recess formed in the first surface with a planar edge being formed around a peripheral edge of the recess.

14. A method of forming a solder ball on a surface mount contact for coupling to an electronic device, the method comprising: providing the surface mount contact; the surface mount contact including a conductive pin having an elongated body including a first end and a second end and a conductive locator member that has a through opening for receiving the pin; forming a concave shaped recess in a first surface of the conductive locator member, with the opening extending through the concave shaped recess, wherein at least the first surface is a non-wettable surface; inserting the pin through the opening so that at least the first end thereof extends beyond the first surface of the conductive locator member; placing a mass of heat re-flowable bonding member within the concave-shaped recess about the first end of the pin; and reflowing the heat re-flowable bonding member so that the heat re-flowable bonding member flows into a spherically-shaped body that forms about and attaches to the first end of the pin.

15. The method of claim 14, wherein the step of placing a mass of heat re-flowable bonding member comprises placing an unshaped mass of solder material with the concave shaped recess surrounding the first end of the pin.

16. The method of claim 14, wherein the step of forming a concave shaped recess in a first surface of the conductive locator member comprises the step of forming the concave shaped recess in a central portion of the first surface such that a planar outer edge is defined surrounding the peripheral edge of the recess.

* * * * *